(12) United States Patent
Wang et al.

(10) Patent No.: US 11,843,079 B2
(45) Date of Patent: Dec. 12, 2023

(54) DISPLAY DEVICE

(71) Applicant: Au Optronics Corporation, Hsinchu (TW)

(72) Inventors: Jhong Yuan Wang, Hsinchu (TW); Yu-Han Chiang, Hsinchu (TW); Shang-Chiang Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 301 days.

(21) Appl. No.: 17/395,484

(22) Filed: Aug. 6, 2021

(65) Prior Publication Data

US 2022/0328736 A1 Oct. 13, 2022

(30) Foreign Application Priority Data

Apr. 8, 2021 (TW) ................................. 110112665

(51) Int. Cl.
  *H01L 33/54* (2010.01)
  *H01L 27/15* (2006.01)
  *H01L 33/44* (2010.01)
  *H01L 33/58* (2010.01)

(52) U.S. Cl.
  CPC ............ *H01L 33/54* (2013.01); *H01L 27/156* (2013.01); *H01L 33/44* (2013.01); *H01L 33/58* (2013.01)

(58) Field of Classification Search
  CPC .......... H01L 33/44; H01L 33/58; H01L 33/52
  See application file for complete search history.

(56) References Cited

U.S. PATENT DOCUMENTS

| 9,786,811 | B2 | 10/2017 | Rol et al. | |
| 10,304,811 | B2 | 5/2019 | Zhang et al. | |
| 10,832,610 | B2 | 11/2020 | Chen et al. | |
| 10,910,356 | B2 | 2/2021 | Zhang et al. | |
| 2006/0152931 | A1* | 7/2006 | Holman | G02B 27/126 257/E25.02 |
| 2007/0211449 | A1 | 9/2007 | Holman et al. | |
| 2011/0198619 | A1* | 8/2011 | Chiang | H01L 25/0753 257/E33.068 |
| 2016/0266297 | A1* | 9/2016 | Hikmet | G02B 26/008 |
| 2017/0069611 | A1* | 3/2017 | Zhang | H01L 25/167 |
| 2019/0244941 | A1 | 8/2019 | Zhang et al. | |
| 2019/0325803 | A1 | 10/2019 | Chen et al. | |
| 2020/0091376 | A1 | 3/2020 | Lim et al. | |
| 2021/0151423 | A1 | 5/2021 | Zhang et al. | |

FOREIGN PATENT DOCUMENTS

| CN | 210984098 | 7/2020 |
| CN | 112530302 | 3/2021 |
| JP | 2012234093 | 11/2012 |
| KR | 100744031 | 8/2007 |
| TW | I543403 | 7/2016 |
| TW | I667643 | 8/2019 |
| TW | I692076 | 4/2020 |

* cited by examiner

*Primary Examiner* — Jay C Chang
*Assistant Examiner* — Mikka Liu
(74) *Attorney, Agent, or Firm* — JCIPRNET

(57) ABSTRACT

A display device includes a substrate, a first light-emitting diode, an encapsulant and a first Fresnel lens. The first light emitting diode is located on the substrate. The encapsulant covers the first light emitting diode. The first Fresnel lens is located on the encapsulant and overlapping with the first light emitting diode. The width of the first Fresnel lens is 4 to 10 times the width of the first light emitting diode.

11 Claims, 4 Drawing Sheets

DISPLAY DEVICE

CROSS-REFERENCE TO RELATED APPLICATION

This application claims the priority benefit of Taiwan application serial no. 110112665, filed on Apr. 8, 2021. The entirety of the above-mentioned patent application is hereby incorporated by reference herein and made a part of this specification.

BACKGROUND

Technical Field

The present invention relates to a display device, and more particularly to a display device including a Fresnel lens.

Description of Related Art

The light-emitting diode (LED) is a kind of electroluminescent semiconductor element, which has the advantages of high efficiency, long life time, not easy to break, fast response, high reliability, and etc. Micro-LED display and organic light-emitting diode display (OLED display) are currently very competitive display devices. Compared with liquid crystal displays, micro-LED displays and OLED displays have a thinner thickness because the backlight module is omitted. In order to further improve the luminous efficiency of micro-LED displays and OLED displays, many manufacturers are committed to research and development to avoid the problem of total reflection of light emitted by the LEDs inside the displays.

SUMMARY

The invention provides a display device having the advantages of high light-emitting efficiency and thin thickness.

At least one embodiment of the present invention provides a display device. The display device includes a substrate, a first light emitting diode, an encapsulant, and a first Fresnel lens. The first light emitting diode is located on the substrate. The encapsulant covers the first light emitting diode. The first Fresnel lens is located on the encapsulant and overlapping with the first light emitting diode. The width of the first Fresnel lens is 4 to 10 times the width of the first light emitting diode.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
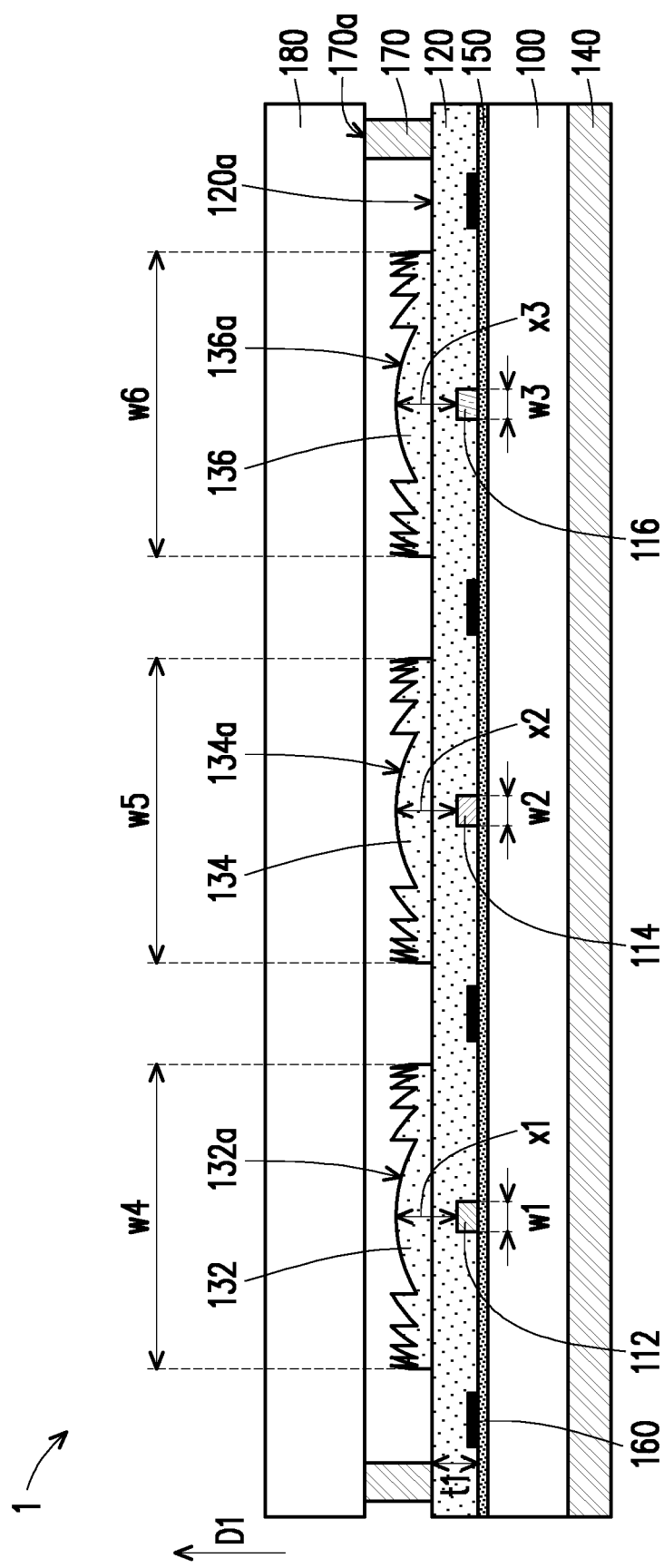
FIG. 1 is a schematic cross-sectional view of a display device according to an embodiment of the invention.

FIG. 1 is a schematic cross-sectional view of a display device according to an embodiment of the invention.

Referring to FIG. 1, the display device 1 includes a substrate 100, a first light emitting diode 112, an encapsulant 120 and a first Fresnel lens 132. In this embodiment, the display device 1 further includes a second light emitting diode 114, a third light emitting diode 116, a second Fresnel lens 134, a third Fresnel lens 136, a reflective substrate 140, and a conductive connection structure 150, a black matrix 160, a supporting structure 170, and a cover lens 80.

In this embodiment, the substrate 100 is an active device substrate. For example, the substrate 100 includes a carrier and a plurality of signal lines and a plurality of active devices formed on the carrier. The aforementioned carrier is, for example, a transparent substrate.

The first light emitting diode 112, the second light emitting diode 114 and the third light emitting diode 116 are located on the substrate 100. The first light emitting diode 112, the second light emitting diode 114, and the third light emitting diode 116 are, for example, micro-light emitting diodes or organic light emitting diodes. In some embodiments, the width w1 of the first light emitting diode 112, the width w2 of the second light emitting diode 114, and the width w3 of the third light emitting diode 116 are 18 micrometers to 381 micrometers.

When the first light emitting diode 112, the second light emitting diode 114, and the third light emitting diode 116 are micro-light emitting diodes, the first light emitting diode 112, the second light emitting diode 114, and the third light emitting diode 116 are electrically connected to signal lines and/or active devices in the substrate 100 through the conductive connection structure 150. The conductive connection structure 150 is, for example, solder, anisotropic conductive glue, or other suitable materials. Although the conductive connection structure 150 covers the entire surface of the substrate 10 in FIG. 1, but the present invention is not limited thereto. In other embodiments, the conductive connection structure 150 only partially covers the substrate 100. In other embodiments, the first light emitting diode 112, the second light emitting diode 114, and the third light emitting diode 116 are organic light emitting diodes and can be electrically connected to signal lines and/or active devices in the substrate 100. For example, the first light emitting diode 112, the second light emitting diode 114, and the third light emitting diode 116 are directly formed on electrodes in the substrate 100, so as to electrically connect the first light emitting diode 112, the second light emitting diode 114, and the third light emitting diode 116 to signal lines and/or active devices in the substrate 100.

The black matrix 160 is located on the substrate 100 and surrounds the first light emitting diode 112, the second light emitting diode 114 and the third light emitting diode 116. In this embodiment, the black matrix 160 is formed on the conductive connection structure 150, but the invention is not limited thereto. In other embodiments, the conductive connection structure 150 is only disposed between the first light emitting diode 112 and the substrate 100, between the second light emitting diode 114 and the substrate 100, and between the third light emitting diode 116 and the substrate 100, and the black matrix 160 is not formed on the conductive connection structure 150. The black matrix 160 is, for example, a black resin, a black photoresist, a material that absorbs light in a specific wavelength range in the spectrum, a black colloid, a metal oxide, a metal nitride, or other light-absorbing materials.

The encapsulant 120 covers the first light emitting diode 112, the second light emitting diode 114, and the third light emitting diode 116. In this embodiment, the encapsulant 120 encapsulates the first light emitting diode 112, the second light emitting diode 114, and the third light emitting diode 116. The thickness t1 of the encapsulant 120 is 8 micrometers to 500 micrometers. Within the aforementioned thickness range, the encapsulant 120 can have a relatively flat surface 120a without significantly affecting the overall thickness of the device.

In some embodiments, the encapsulant 120 optionally also covers the black matrix 160. The encapsulant 120 is, for example, silicone, epoxy, optically clear adhesive, or other materials. In some embodiments, the refractive index of the encapsulant 120 is 1.5 to 1.6.

The first Fresnel lens 132, the second Fresnel lens 134 and the third Fresnel lens 136 are located on the encapsulant 120. In some embodiments, the first Fresnel lens 132, the second Fresnel lens 134, and the third Fresnel lens 136 are formed on the surface 120a of the encapsulant 120, and the first Fresnel lens 132, the second Fresnel lens 134, the third Fresnel lens 136 and the encapsulant 120 may include the same or different materials. In this embodiment, the first Fresnel lens 132, the second Fresnel lens 134, and the third Fresnel lens 136 are separated from each other. In other embodiments, the first Fresnel lens 132, the second Fresnel lens 134, the third Fresnel lens 136, and the encapsulant 120 include the same material. In other embodiments, the first Fresnel lens 132 and the encapsulant 120 are integrally formed, the second Fresnel lens 134 and the encapsulant 120 are integrally formed, and the third Fresnel lens 136 and the encapsulant 120 are integrally formed.

The first Fresnel lens 132, the second Fresnel lens 134, and the third Fresnel lens 136 are, for example, silicone, epoxy, optically clear adhesive or other materials. In some embodiments, the refractive indexes of the first Fresnel lens 132, the second Fresnel lens 134, and the third Fresnel lens 136 are 1.5 to 1.6. The refractive index of the first Fresnel lens 132, the second Fresnel lens 134, and the third Fresnel lens 136 is approximately equal to the refractive index of the encapsulant 120 (for example, approximately equal to 1.5), thereby reducing the possibility of refraction of light on the surface 120a.

The first Fresnel lens 132 is overlapping with the first light emitting diode 112. The second Fresnel lens 134 is overlapping with the second light emitting diode 114. The third Fresnel lens 136 is overlapping with the third light emitting diode 116. In this embodiment, in the direction D1 perpendicular to the substrate 100, the center of the first Fresnel lens 132, the center of the second Fresnel lens 134, and the center of the third Fresnel lens 136 are respectively overlapping with the center of the first light emitting diode 112, the center of the second light emitting diode 114, and the center of the third light emitting diode 116, thereby increasing the light-emitting efficiency of the display device 1. In this embodiment, the black matrix 120 is not overlapping with the first Fresnel lens 132, the second Fresnel lens 134, and the third Fresnel lens 136.

The width w4 of the first Fresnel lens 132 is 4 to 10 times the width w1 of the first light emitting diode 112. The width w5 of the second Fresnel lens 134 is 4 to 10 times the width w2 of the second light emitting diode 114. The width w6 of the third Fresnel lens 136 is 4 to 10 times the width w3 of the third light emitting diode 116. In this embodiment, the widths w4, w5, and w6 are greater than or equal to 4 times the widths w1, w2, and w3, which is beneficial to increase the light-emitting efficiency of the display device 1. However, in order to avoid excessive reflection, the widths w4, w5, and w6 are not more than 10 times the widths w1, w2, and w3.

The radius of curvature of the first Fresnel lens 132 is 45%-55% of the width w4 of the first Fresnel lens 132. The radius of curvature of the second Fresnel lens 134 is 45%-55% of the width w5 of the second Fresnel lens 132. The radius of curvature of the third Fresnel lens 136 is 45%-55% of the width w6 of the third Fresnel lens 136.

The distance x1 from the top surface 132a of the first Fresnel lens 132 to the first light emitting diode 112 is 8 micrometers to 500 micrometers. The distance x2 from the top surface 134a of the second Fresnel lens 134 to the second light emitting diode 114 is 8 micrometers to 500 micrometers. The distance x3 from the top surface 136a of the third Fresnel lens 136 to the third light emitting diode 116 is 8 micrometers to 500 micrometers.

The supporting structure 170 is located on the encapsulant 120. The cover lens 180 is overlapping with the substrate 100, and the supporting structure 170 is located between the substrate 100 and the cover lens 180. The top surface 170a of the supporting structure 170 is closer to the cover lens 180 than the top surface 132a of the first Fresnel lens 132, the top surface 134a of the second Fresnel lens 134, and the top surface 136a of the third Fresnel lens 136. Therefore, the supporting structure 170 is beneficial to prevent the cover lens 180 from squeezing the first Fresnel lens 132, the second Fresnel lens 134, and the third Fresnel lens 136.

Based on the above, the width w4 of the first Fresnel lens 132 is greater than or equal to 4 times the width w1 of the first light emitting diode 112, which is beneficial to increase the light-emitting efficiency of the display device 1.

Figure 2:
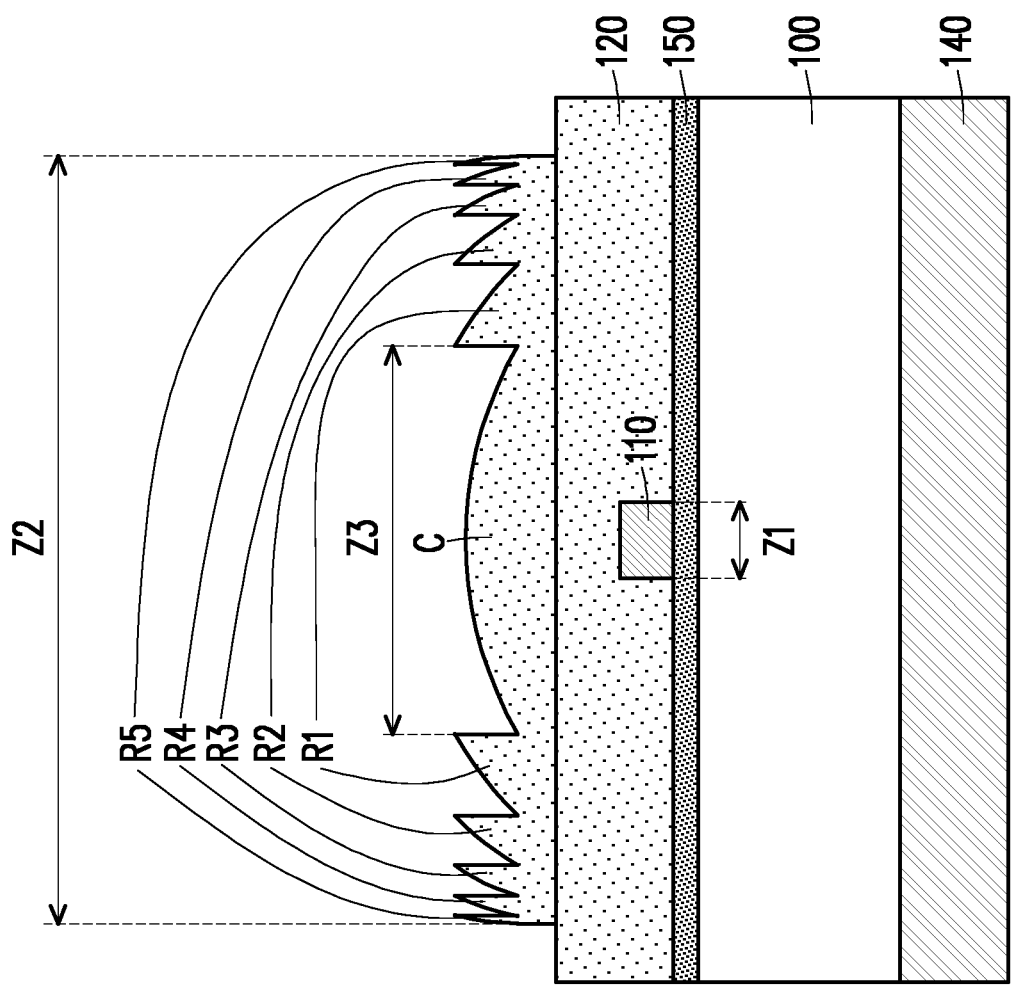
FIG. 2 is a schematic cross-sectional view of a display device according to an embodiment of the invention.

FIG. 2 is a schematic cross-sectional view of a display device according to an embodiment of the invention. It must be noted here that the embodiment of FIG. 2 follows the reference numerals and partial contents of the embodiment of FIG. 1, wherein the same or similar components are denoted by the same or similar reference numerals, and the description of the same technical content is omitted. For the description of the omitted parts, reference may be made to the foregoing embodiments and will not be repeated in the following embodiments.

Referring to FIG. 2, in this embodiment, the top surface of the Fresnel lens 130 includes a circular protrusion C located in the center, a first annular protrusion R1 surrounding the circular protrusion C, a second annular protrusion R2 surrounding the first annular protrusion R1, a third annular protrusion R3 surrounding the second annular protrusion R2, a fourth annular protrusion R4 surrounding the third annular protrusion R3, and the fifth annular protrusion R5 surrounding the fourth annular protrusion R4. In this embodiment, the Fresnel lens 130 includes five annular protrusions, but the present invention is not limited thereto. The number of annular protrusions can be adjusted according to actual needs.

In some embodiments, the width Z3 of the circular protrusion C is greater than the width Z1 of the light emitting diode 110, so that the Fresnel lens 130 is easier to align with the light emitting diode 110.

Figure 3:
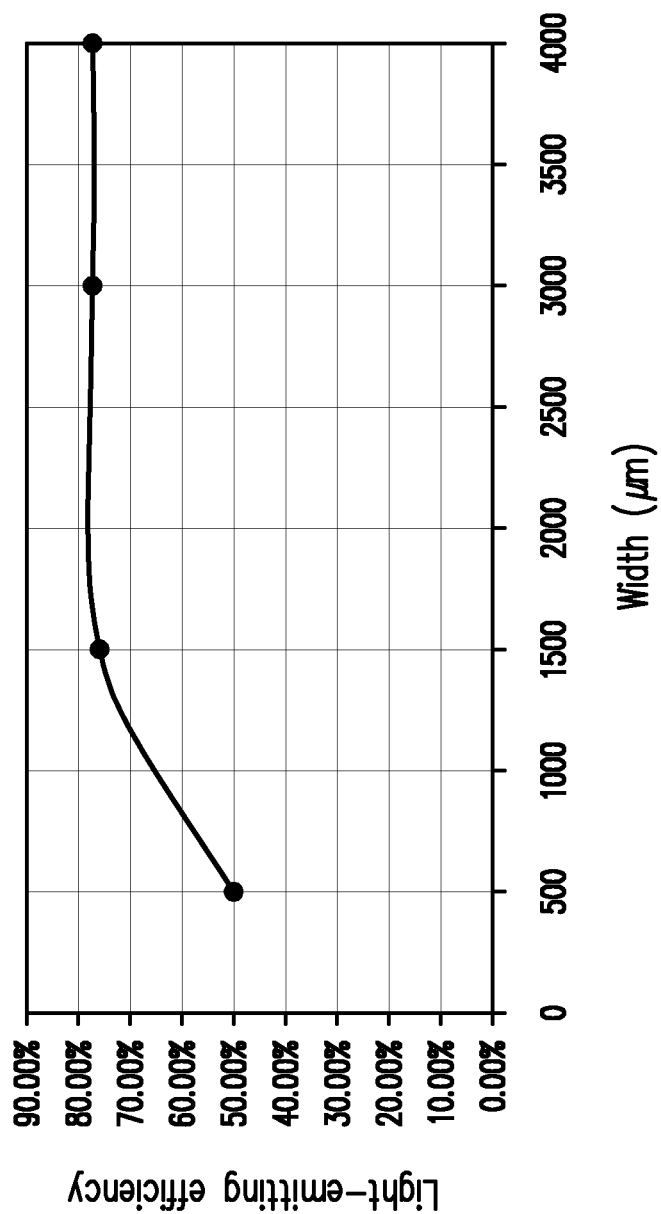
FIG. 3 is a line graph of the width of the Fresnel lens and the light-emitting efficiency of the display device according to an embodiment of the present invention.

FIG. 3 is a line graph of the width Z2 of the Fresnel lens 130 (as shown in FIG. 2) and the light-emitting efficiency of the display device according to an embodiment of the present invention. For example, the width Z1 of the light emitting diode 110 is 130 micrometers, and when the width Z2 of the Fresnel lens 130 is greater than or equal to 10 times of the width Z1 of the light emitting diode 110 (1300 microns), the display device has excellent light-emitting efficiency.

The relationship between the width Z2 of the Fresnel lens 130, the radius of curvature of the Fresnel lens 130, and the light-emitting efficiency of the display device (taking green light as an example) is shown in Table 1.

TABLE 1

| The width of the Fresnel lens | The radius of curvature of the Fresnel lens | Light efficiency |
|---|---|---|
| 500 microns | 250 microns | 50.08% |
| 1500 microns | 750 microns | 76.09% |
| 3000 microns | 1050 microns | 77.16% |
|  | 1500 microns | 77.29% |
| 4000 microns | 2000 microns | 77.48% |

It can be known from Table 1 that when the radius of curvature of the Fresnel lens 130 is 50% of the width Z2 of the Fresnel lens 130, the display device has better light-emitting efficiency.

Figure 4:
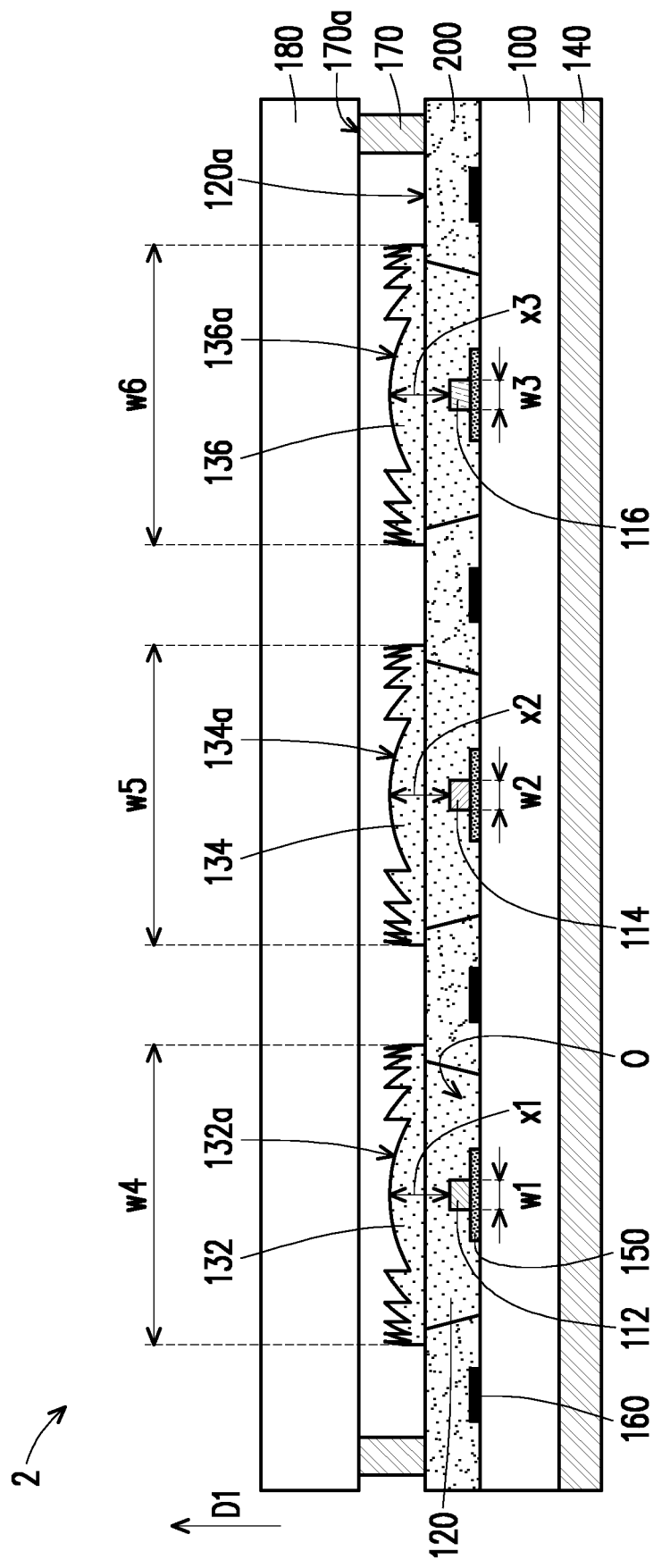
FIG. 4 is a schematic cross-sectional view of a display device according to an embodiment of the invention.

FIG. 4 is a schematic cross-sectional view of a display device according to an embodiment of the invention. It must be noted here that the embodiment of FIG. 4 follows the reference numerals and partial contents of the embodiment of FIG. 1, wherein the same or similar components are denoted by the same or similar reference numerals, and the description of the same technical content is omitted. For the description of the omitted parts, reference may be made to the foregoing embodiments and will not be repeated in the following embodiments.

The main difference between the display device 2 in FIG. 4 and the display device 1 in FIG. 1 is that the display device 2 further includes a bank structure 200.

In this embodiment, the bank structure 200 surrounds the first light emitting diode 112, the second light emitting diode 114, and the third light emitting diode 116. The encapsulant 120 fills the openings O of the bank structure 200 and covers the first light emitting diode 112, the second light emitting diode 114, and the third light emitting diode 116. In the direction D1 perpendicular to the substrate 100, the top surface 132a of the first Fresnel lens 132, the top surface 134a of the second Fresnel lens 134, and the top surface 136a of the third Fresnel lens 136 is overlapping with the sidewall of the openings O of the bank structure 200 and a part of the top surface of the bank structure 200.

Base on the aforementioned, in the display device of the present invention, the width of the Fresnel lens is greater than or equal to 4 times the width of the light emitting diode, thereby effectively improving the light-emitting efficiency of the display device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device, comprising:
a substrate;
a first light emitting diode, located on the substrate;
an encapsulant, covering the first light emitting diode;
a first Fresnel lens, located on the encapsulant and overlapping with the first light emitting diode, wherein a width of the first Fresnel lens is 4 to 10 times a width of the first light emitting diode;
a second light emitting diode, located on the substrate, and the encapsulant covers the second light emitting diode;
a second Fresnel lens, located on the encapsulant and overlapping with the second light emitting diode, wherein a width of the second Fresnel lens is 4 to 10 times a width of the second light emitting diode, and the second Fresnel lens is separated from the first Fresnel lens; and
a black matrix, located on the substrate and surrounding the first light emitting diode and the second light emitting diode, wherein the black matrix is not overlapping with the first Fresnel lens and the second Fresnel lens.

2. The display device of claim 1, wherein the encapsulant encapsulates the first light emitting diode, and the first Fresnel lens is located on a surface of the encapsulant.

3. The display device of claim 1, wherein the first Fresnel lens and the encapsulant have a same material, and a refractive index of the first Fresnel lens is 1.5.

4. The display device of claim 1, wherein the encapsulant covers the black matrix.

5. The display device of claim 1, wherein a radius of curvature of the first Fresnel lens is 45%-55% of the width of the first Fresnel lens.

6. The display device of claim 1, wherein the width of the first light emitting diode is 18 micrometers to 381 micrometers.

7. The display device of claim 1, wherein a distance from a top surface of the first Fresnel lens to the first light emitting diode is 8 micrometers to 500 micrometers.

8. The display device of claim 1, wherein in a direction perpendicular to the substrate, a center of the first Fresnel lens is overlapping with a center of the first light emitting diode.

9. The display device of claim 1, wherein a top surface of the first Fresnel lens includes a circular protrusion at a center of the first Fresnel lens, a first annular protrusion surrounding the circular protrusion, a second annular protrusion surrounding the first annular protrusion, and a third annular protrusion surrounding the second annular protrusion, wherein a width of the circular protrusion is greater than the width of the first light emitting diode.

10. The display device of claim 1, further comprises:
a supporting structure; and
a cover lens, overlapping with the substrate, and the supporting structure is located between the substrate and the cover lens, wherein a top surface of the supporting structure is closer to the cover lens than a top surface of the first Fresnel lens.

11. The display device of claim 1, further comprises:
a bank structure, surrounding the first light emitting diode, wherein the encapsulant fills an opening of the bank structure and covers the first light emitting diode, wherein in a direction perpendicular to the substrate, a top surface of the first Fresnel lens is overlapping with a side wall of the opening of the bank structure and a part of a top surface of the bank structure.

* * * * *